United States Patent
Jau et al.

(10) Patent No.: US 9,443,559 B2
(45) Date of Patent: Sep. 13, 2016

(54) TRAY ASSEMBLY

(71) Applicant: Quanta Computer Inc., Taoyuan Shien (TW)

(72) Inventors: Maw-Zan Jau, Taipei (TW); Chao-Jung Chen, New Taipei (TW); Yaw-Tzorng Tsorng, Taipei (TW); Chen-Chien Kuo, Taipei (TW); Kun-Pei Liu, New Taipei (TW)

(73) Assignee: Quanta Computer Inc., Tao Yuan Shien (TW)

( * ) Notice: Subject to any disclaimer, the term of this patent is extended or adjusted under 35 U.S.C. 154(b) by 30 days.

(21) Appl. No.: 14/331,870

(22) Filed: Jul. 15, 2014

(65) Prior Publication Data
US 2015/0327414 A1    Nov. 12, 2015

(30) Foreign Application Priority Data
May 7, 2014    (TW) ............... 103116274 A

(51) Int. Cl.
*B65D 85/00* (2006.01)
*G11B 33/12* (2006.01)
(Continued)

(52) U.S. Cl.
CPC ........... *G11B 33/124* (2013.01); *G11B 33/022* (2013.01); *H05K 13/0084* (2013.01); *B65D 47/046* (2013.01); *B65D 47/20* (2013.01)

(58) Field of Classification Search
CPC .. H05K 13/0084; H05K 7/1487; H05K 7/16; B65D 47/046; B65D 47/20; B65D 45/04; B65D 45/12; B65D 45/06; B65D 83/0033; B65D 50/069
USPC ............ 206/751, 754, 758, 761; 361/679.59, 361/807, 810
See application file for complete search history.

(56) References Cited

U.S. PATENT DOCUMENTS

| 4,426,122 A | * | 1/1984 | Lainez ................ | A62B 18/082 361/679.55 |
| 6,616,106 B1 | * | 9/2003 | Dean ..................... | G06F 1/184 248/27.1 |

(Continued)

FOREIGN PATENT DOCUMENTS

| JP | 2002-343075 | 11/2002 |
| JP | 2005-327390 | 11/2005 |

(Continued)

OTHER PUBLICATIONS

English language abstract for TW M 329836; published Apr. 1, 2008.

(Continued)

*Primary Examiner* — Anthony Stashick
*Assistant Examiner* — James Way
(74) *Attorney, Agent, or Firm* — Polsinelli PC

(57) ABSTRACT

A tray assembly configured for carrying a storage device is provided. The tray assembly includes a carrier, a base frame, a handle and a connecting rod. The carrier carries the storage device. The base frame slidably connects with the carrier, allowing the carrier to slide between a first position and a second position relative to the base frame. The base frame includes a locking part and the handle pivots to the base frame. Two ends of the connecting rod respectively pivot to the carrier and the handle. When the handle rotates relative to the base frame and drives the carrier to slide to the first position, the carrier is carried on the base frame and the handle locks up with the locking part. When the handle rotates relative to the base frame and drives the carrier to slide to the second position, the carrier tilts relative to the base frame.

10 Claims, 3 Drawing Sheets

(51) Int. Cl.
H05K 13/00 (2006.01)
G11B 33/02 (2006.01)
B65D 47/04 (2006.01)
B65D 47/20 (2006.01)

(56) References Cited

U.S. PATENT DOCUMENTS

| | | | | |
|---|---|---|---|---|
| 6,625,014 | B1* | 9/2003 | Tucker | G06F 1/184 312/223.1 |
| 7,325,682 | B2* | 2/2008 | Seymour | B25H 3/003 206/379 |
| 7,440,273 | B2* | 10/2008 | Chen | G06F 1/187 361/679.33 |
| 7,477,512 | B2* | 1/2009 | Sung | G11B 33/123 361/679.33 |
| 2006/0171109 | A1* | 8/2006 | Chang | G06F 1/184 361/679.33 |
| 2011/0289521 | A1 | 11/2011 | Chen | |

FOREIGN PATENT DOCUMENTS

| | | |
|---|---|---|
| JP | 3140594 U | 3/2008 |
| TW | M 329836 | 4/2008 |

OTHER PUBLICATIONS

Office Action mailed Oct. 6, 2014; in a corresponding Taiwanese patent application.
First Office Action mailed in Japanese Application No. 2014-147815 on Nov. 4, 2015.
English language summary of First Office Action mailed in Japanese Application No. 2014-147815 on Nov. 4, 2015.
English language translation of Abstract of JP 3140594.
English language translation of Abstract of JP 2002-343075.
English language translation of Abstract of JP 2005-327390.

* cited by examiner

TRAY ASSEMBLY

RELATED APPLICATIONS

This application claims priority to Taiwan Application Serial Number 103116274, filed May 7, 2014, which is herein incorporated by reference.

BACKGROUND

1. Technical Field

The present disclosure relates to a tray assembly. More particularly, the present disclosure relates to a tray assembly configured for carrying a storage device.

2. Description of Related Art

With increasing demands for the storage volume of a computer, more hard disks are required to be installed in the computer. Therefore, a hard disk tray is developed to allow users to install multiple hard disks in the computer at the same time. Generally speaking, such a hard disk tray enables individual installation/uninstallation of the hard disks to the computer, which allows the independent exchange of the hard disks at any time and even instant uninstallation for the maintenance of the required hard disk. As a result, the user can replace hard disks at any time or any occasions, or add even more hard disks in the computer as demands.

Traditionally, in order to install a hard disk to the hard disk tray, the user has to in advance lock and fix the hard disk to respective frames by screws, and then individually secure the frames to the hard disk tray by screws. Since specific tools are required for such installation and uninstallation which are time consuming, and the screws may even accidentally fall into the hard disk tray, each time of such installation/uninstallation of the hard disk is very inconvenient for the user.

SUMMARY

A technical aspect of the present disclosure provides a tray assembly, which allows the user to install or uninstall a storage device into or from a storage device tray in a simple and easy manner without using any extra tools.

According to an embodiment of the present disclosure, a tray assembly configured for carrying a storage device is provided. The tray assembly includes a carrier, a base frame, a handle and a connecting rod. The carrier carries the storage device. The base frame is slidably connected with the carrier, allowing the carrier to slide between a first position and a second position relative to the base frame. The base frame includes a locking part. The handle is pivoted to the base frame. Two ends of the connecting rod are respectively pivoted to the carrier and the handle. When the handle rotates relative to the base frame and drives the carrier to slide to the first position, the carrier is carried on the base frame and the handle locks up with the locking part. When the handle rotates relative to the base frame and drives the carrier to slide to the second position, the carrier tilts relative to the base frame.

In one or more embodiments of the present disclosure, the carrier includes a first guiding structure. The base frame further includes a base plate and a first side wall. The locking part is connected with the base plate. The first side wall is connected with the base plate and has a second guiding structure. The second guiding structure and the first guiding structure are slidably connected.

In one or more embodiments of the present disclosure, the first guiding structure is a guiding slot, and the second guiding structure is a guiding block.

In one or more embodiments of the present disclosure, the first guiding structure is a guiding block, and the second guiding structure is a guiding slot.

In one or more embodiments of the present disclosure, the second guiding structure includes a first guiding section and a second guiding section. The first guiding section is formed along a first guiding direction. The second guiding section is connected with the first guiding section and is located between the first guiding section and the locking part. The second guiding section is formed along a second guiding direction. An angle is formed between the second guiding direction and the first guiding direction.

In one or more embodiments of the present disclosure, the first guiding direction and the base plate are substantially parallel to each other. The second guiding direction is away from the base plate as pointed towards the locking part.

In one or more embodiments of the present disclosure, the carrier further includes a carrier plate and at least one side plate. The carrier plate abuts the storage device. The side plate is connected with the carrier plate. The first guiding structure is located at the side plate.

In one or more embodiments of the present disclosure, the carrier further includes a positioning part. The positioning part is disposed on the carrier plate, and is configured for mutually snapping with a positioning hole of the storage device.

In one or more embodiments of the present disclosure, the base frame further includes a base plate and a second side wall. The second side wall is connected with the base plate. The handle includes a fulcrum, a first lever arm, a second lever arm and a grip. The fulcrum is pivoted to the second side wall. The first lever arm is connected with the fulcrum and has a first length. The second lever arm is connected with the fulcrum and is pivoted to the connecting rod. The second lever arm has a second length. The first length is longer than the second length. The grip is connected with the first lever arm. The handle locks up with the locking part by the grip.

In one or more embodiments of the present disclosure, the first lever arm includes a pressing part. When the grip locks up with the locking part, the pressing part presses the storage device.

When compared with the prior art, the embodiments of the present disclosure mentioned above have at least the following advantages:

(1) In the embodiments of the present disclosure as mentioned above, the handle rotates relative to the base frame and drives the carrier to slide to the first position. At this point, the carrier is carried on the base frame, and the handle locks up with the locking part. Therefore, the carrier can be fixed at the first position. Correspondingly, the storage device carried on the carrier can also be fixed. Thus, the user can install and fix the storage device into the tray assembly in a simple and easy manner without using any extra tools. In the practical applications, the tray assembly is fixed in a storage device tray. In the other words, the storage device can be fixed in the storage device tray in a simple and easy manner.

(2) In the embodiments of the present disclosure as mentioned above, the handle rotates relative to the base frame and drives the carrier to slide to the second position. At this point, the carrier tilts relative to the base frame, so as to facilitate the user to take out directly the storage device from the carrier (or to put the storage device on the carrier).

Therefore, the user can uninstall and take out the storage device from the tray assembly in a simple and easy manner without using any extra tools.

(3) The handle includes the first lever arm and the second lever arm, and the first length of the first lever arm is longer than the second length of the second lever arm. When the carrier slides between the first position and the second position relative to the base frame, the force that the user exerts on the handle can be increased through leverage. Thus, the user can exert less force for sliding the carrier.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
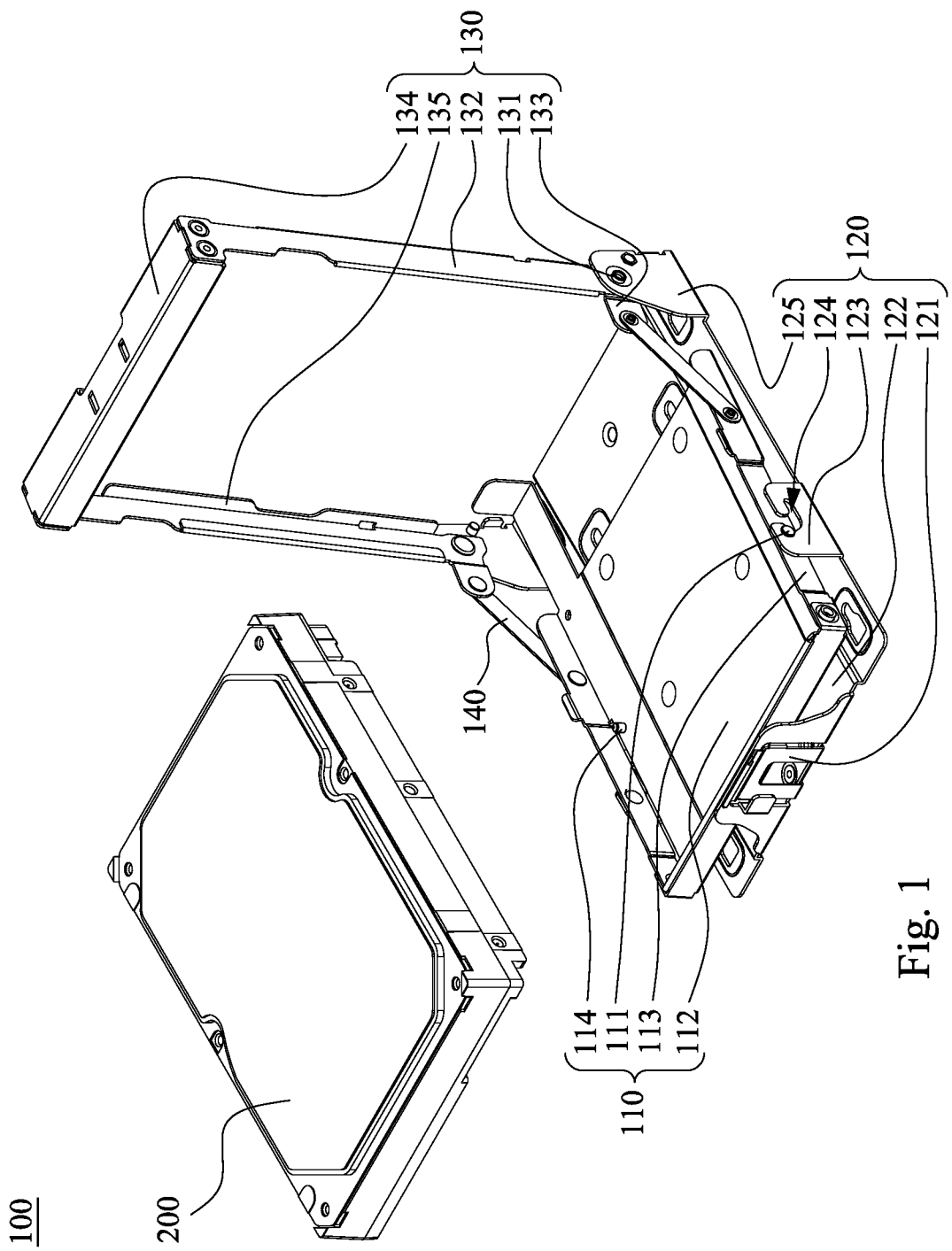
FIG. 1 is a perspective view of a tray assembly according to an embodiment of the present disclosure, with a storage device uninstalled from the tray assembly.

Drawings will be used below to disclose a plurality of embodiments of the present disclosure. For the sake of clear illustration, many practical details will be explained together in the description below. However, it is appreciated that the practical details should not be used to limit the claimed scope. In other words, in some embodiments of the present disclosure, the practical details are not essential. Moreover, for the sake of drawing simplification, some customary structures and elements in the drawings will be schematically shown in a simplified way. Wherever possible, the same reference numbers are used in the drawings and the description to refer to the same or like parts.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
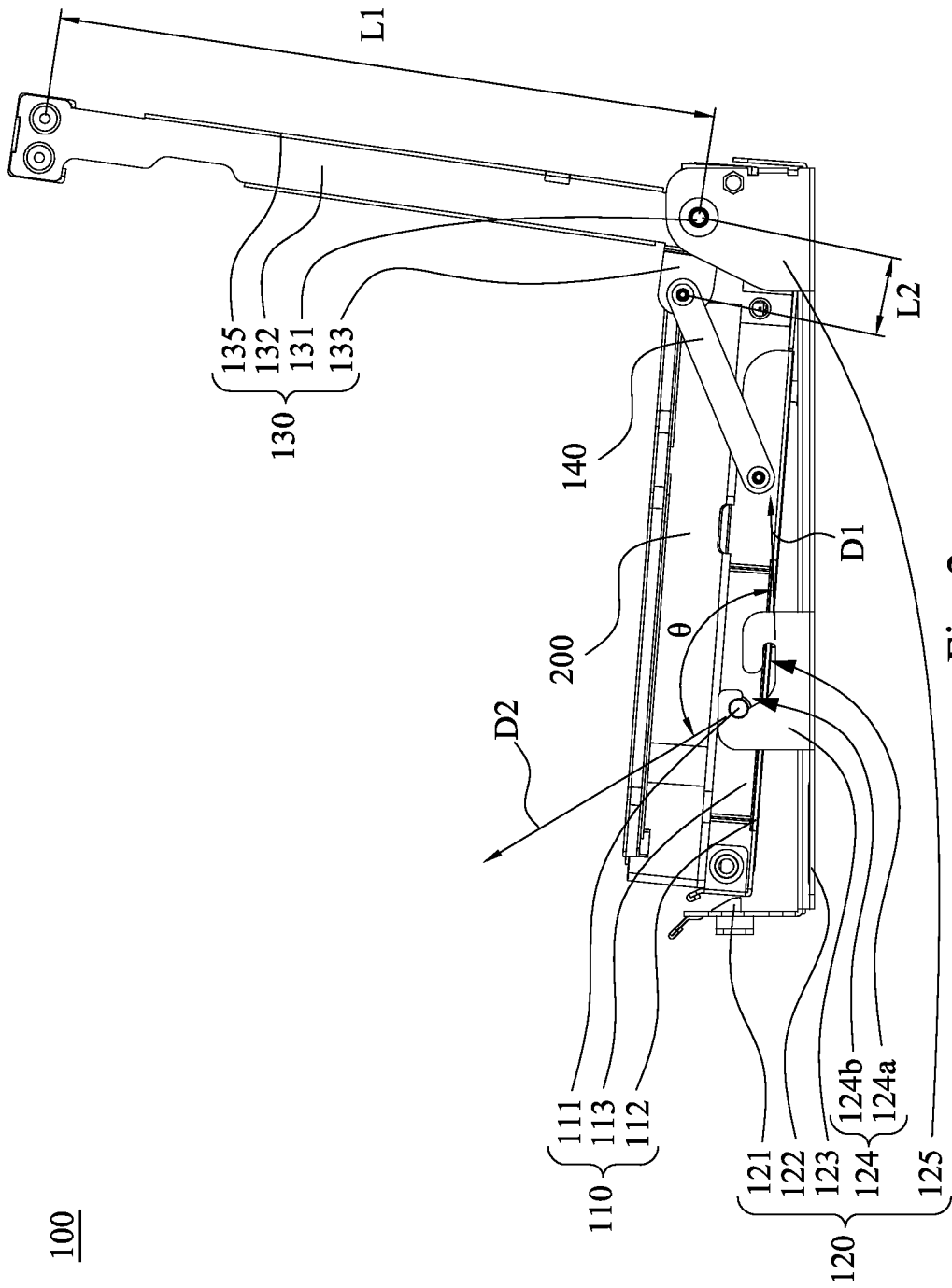
FIG. 2 is a side view of the tray assembly of FIG. 1, in which the carrier carries the storage device and slides to a second position.
Figure 3:
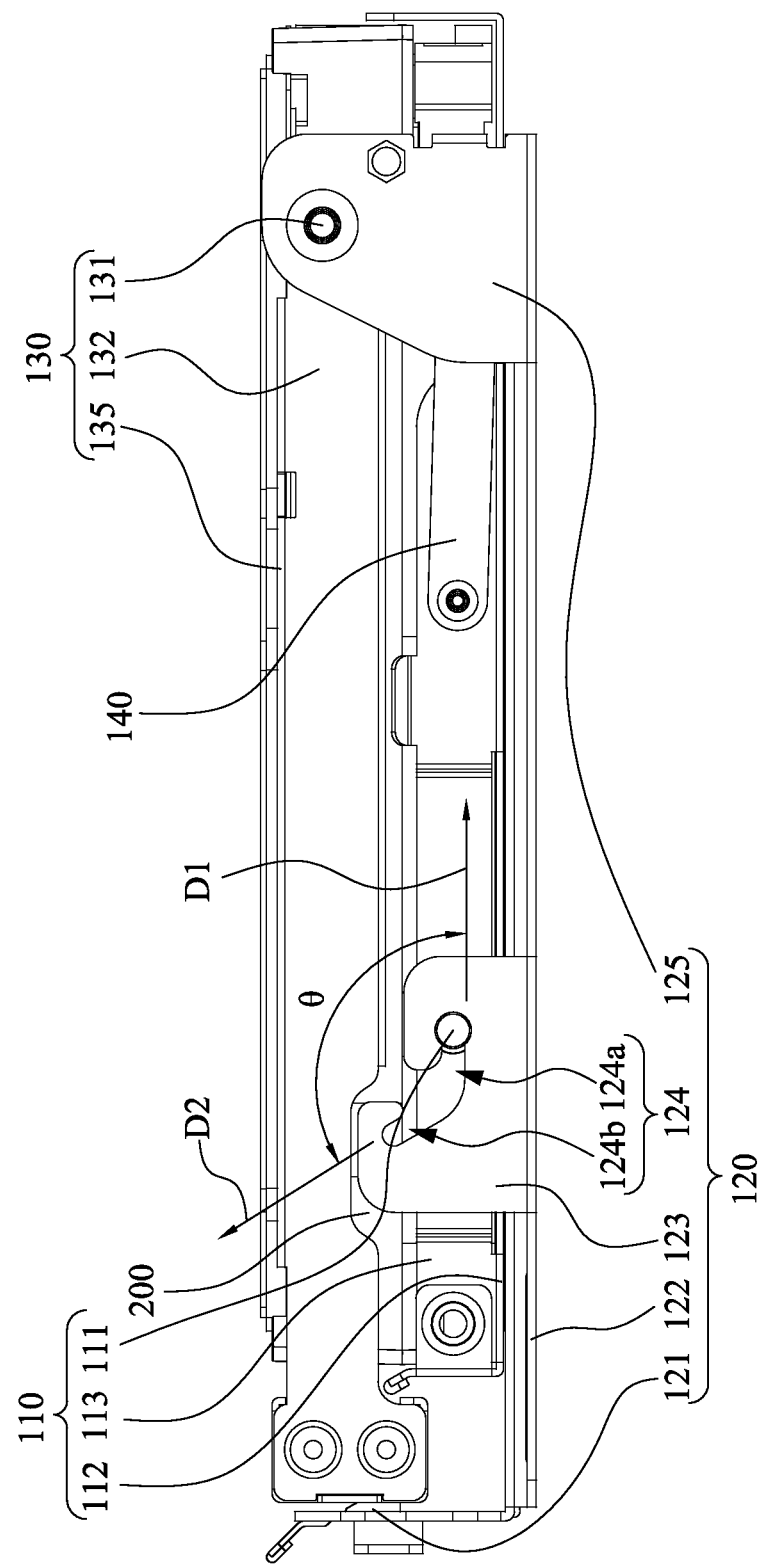
FIG. 3 is a side view of the tray assembly of FIG. 1, in which the carrier carries the storage device and slides to a first position.

FIG. 1 is a perspective view of a tray assembly 100 according to an embodiment of the present disclosure, with a storage device 200 uninstalled from the tray assembly 100. FIG. 2 is a side view of the tray assembly 100 of FIG. 1, in which the carrier 110 carries the storage device 200 and slides to a second position. FIG. 3 is a side view of the tray assembly 100 of FIG. 1, in which the carrier 110 carries the storage device 200 and slides to a first position. As shown in FIGS. 1-3, the tray assembly 100 configured for carrying a storage device 200 is provided. The tray assembly 100 includes a carrier 110, a base frame 120, a handle 130 and a connecting rod 140. The carrier 110 carries the storage device 200. The base frame 120 is slidably connected with the carrier 110, allowing the carrier 110 to slide between the first position and the second position relative to the base frame 120. The base frame 120 includes a locking part 121. The handle 130 is pivoted to the base frame 120. Two ends of the connecting rod 140 are respectively pivoted to the carrier 110 and the handle 130. When the handle 130 rotates relative to the base frame 120 and drives the carrier 110 to slide to the first position, the carrier 110 is carried on the base frame 120 and the handle 130 locks up with the locking part 121. When the handle 130 rotates relative to the base frame 120 and drives the carrier 110 to slide to the second position, the carrier 110 tilts relative to the base frame 120.

In other words, when the handle 130 locks up with the locking part 121, that is, when the carrier 110 slides to the first position, the storage device 200 is carried and fixed at the tray assembly 100. Generally speaking, the tray assembly 100 is installed in a storage device tray (not shown in the figures). Thus, when the carrier 100 slides to the first position, the procedure that the storage device 200 is installed to the storage device tray is also completed. In contrast, when the carrier 100 slides to the second position, the procedure that the storage device 200 is uninstalled from the storage device tray is also completed. Moreover, the carrier 110 tilts relative to the base frame 120, so as to facilitate the user to take out directly the storage device 200 from the carrier 110 (or to put the storage device 200 on the carrier 110). Thus, the user can slide the carrier 110 to either the first position or the second direction by directly rotating the handle 130, which respectively means the installation of the storage device 200 to the storage device tray, or the uninstallation and taking out of the storage device 200 from the storage device tray. As a result, no matter the installation or the uninstallation, the procedures can be carried out in a simple and easy manner, and it is not necessary for the user to use any extra tools throughout the procedures. In the practical applications, the storage device 200 can be a hard disk, and the storage device tray can be a hard disk tray or a computer casing. However, this does not limit the present disclosure.

As shown in FIGS. 1-3, the carrier 100 includes a carrier plate 112 and a side plate 113. The carrier plate 112 abuts the storage device 200. The side plate 113 is connected with the carrier plate 112. The first guiding structure 111 is located at the side plate 113.

Relatively, the carrier 120 includes a base plate 122 and a first side wall 123. The first side wall 123 is connected with the base plate 122 and has a second guiding structure 124, in which the second guiding structure 124 and the first guiding structure 111 are slidably connected. As a result, the route that the carrier 110 slides between the first position and the second position will be restricted by the guiding of the first guiding structure 111 and the second guiding structure 124.

For the sake of design simplification, in this embodiment, the first guiding structure 111 is a guiding block, and the second guiding structure 124 is a guiding slot relatively.

In contrast, in other embodiments, the first guiding structure 111 can be a guiding slot, and the second guiding structure 124 can be a guiding block relatively. However, it is noted that the form of the first guiding structure 111 and the second guiding structure 124 as cited herein is only illustrative and is not to limit the claimed scope. A person having ordinary skill in the art of the present disclosure should appropriately design the form of the first guiding structure 111 and the second guiding structure 124.

To illustrate this embodiment with the second guiding structure 124 as a guiding slot, as shown in FIGS. 2-3, the second guiding structure 124 includes a first guiding section 124a and a second guiding section 124b. The first guiding section 124a is formed along a first guiding direction D1. The second guiding section 124b is connected with the first guiding section 124a and is located between the first guiding section 124a and the locking part 121. The second guiding section 124b is formed along a second guiding direction D2. In this embodiment, an angle θ is formed between the second guiding direction D2 and the first guiding direction D1. The angle θ allows the change of the angle of the carrier 110 relative to the base frame 120 when the carrier 110 slides between the first position and the second position.

Furthermore, in this embodiment, the first guiding direction D1 and the base plate 122 are substantially parallel to each other, and the second guiding direction D2 is away from the base plate 122 as pointed towards the locking part 121. In other words, when the carrier 110 slides to the first position, the carrier 110 and the base plate 122 are also substantially parallel to each other. This helps to install the storage device 200 carried on the carrier 110 to the storage device tray. In contrast, when the carrier 110 slides to the second position, the carrier 110 will be tilted away from the base plate 122 as pointed towards the locking part 121, under the guiding of the second guiding section 124b towards the second guiding direction D2. This facilitates the user to take out the storage device 200 from the carrier 110 (or to put the storage device 200 on the carrier 110). On the other hand, the second guiding section 124b can be of a curved shape, that is, the second guiding direction D2 is a curve. However, this does not limit the present disclosure.

Please refer to FIG. 1. As shown in FIG. 1, the carrier 110 includes a positioning part 114. The positioning part 114 is disposed on the carrier plate 112, and is configured for mutually snapping with a positioning hole (not shown in the figures) of the storage device 200. When two or more positioning parts 114 snap with the positioning holes of the storage device 200, the relative position of the storage device 200 and the carrier 110 can be fixed.

As shown in FIGS. 1-3, the base frame 120 includes a second side wall 125, and the second side wall 125 is connected with the base plate 122. The handle 130 includes a fulcrum 131, a first lever arm 132, a second lever arm 133 and a grip 134. The fulcrum 131 is pivoted to the second side wall 125.

The first lever arm 132 is connected with the fulcrum 131 and has a first length L1. The second lever arm 133 is connected with the fulcrum 131 and is pivoted to the connecting rod 140. The second lever arm 133 has a second length L2. The first length L1 is longer than the second length L2. As a result, when the carrier 110 slides between the first position and the second position relative to the base frame 120, the force that the user exerts on the handle 130 can be increased through leverage. Thus, the user can exert less force for sliding the carrier 110. Moreover, the grip 134 is connected with the first lever arm 132, in which the handle 130 locks up with the locking part 121 by the grip 134. The locking part 121 is connected with the base plate 122.

As shown in FIGS. 1-3, the first lever arm 132 includes a pressing part 135. As shown in FIG. 3, when the grip 134 locks up with the locking part 121, that is, when the carrier 110 slides to the first position, in order to prevent the storage device 200 from detaching from the carrier 110, the pressing part 135 of the first lever arm 132 will correspondingly press the storage device 200, such that the relative position of the storage device 200 and the carrier 110 can be fixed.

In summary, when compared with the prior art, the embodiments of the present disclosure mentioned above have at least the following advantages:

(1) In the embodiments of the present disclosure as mentioned above, the handle rotates relative to the base frame and drives the carrier to slide to the first position. At this point, the carrier is carried on the base frame, and the handle locks up with the locking part. Therefore, the carrier can be fixed at the first position. Correspondingly, the storage device carried on the carrier can also be fixed. Thus, the user can install and fix the storage device into the tray assembly in a simple and easy manner without using any extra tools. In the practical applications, the tray assembly is fixed in a storage device tray. In the other words, the storage device can be fixed in the storage device tray in a simple and easy manner.

(2) In the embodiments of the present disclosure as mentioned above, the handle rotates relative to the base frame and drives the carrier to slide to the second position. At this point, the carrier tilts relative to the base frame, so as to facilitate the user to take out directly the storage device from the carrier (or to put the storage device on the carrier). Therefore, the user can uninstall and take out the storage device from the tray assembly in a simple and easy manner without using any extra tools.

(3) The handle includes the first lever arm and the second lever arm, and the first length of the first lever arm is longer than the second length of the second lever arm. When the carrier slides between the first position and the second position relative to the base frame, the force that the user exerts on the handle can be increased through leverage. Thus, the user can exert less force for sliding the carrier.

Although the present disclosure has been described in considerable detail with reference to certain embodiments thereof, other embodiments are possible. Therefore, the spirit and scope of the appended claims should not be limited to the description of the embodiments contained herein.

It will be apparent to the person having ordinary skill in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. An electronic storage device tray assembly configured for carrying an electronic storage device, the electronic storage device tray assembly comprising:
   a carrier adapted to receive the electronic storage device;
   a base frame slidably connected with the carrier, enabling the carrier to translate along a guiding structure between a first position substantially parallel with the base frame and a second position not parallel with the base frame, the base frame comprising a locking part;
   a handle pivoted to the base frame; and
   a connecting rod, two ends of the connecting rod being respectively pivoted to the carrier and the handle,
   wherein when the handle rotates relative to the base frame at a fulcrum and drives the connecting rod to slide the carrier to the first position along the guiding structure restricting the movement of the carrier, the carrier is carried on the base frame and the handle locks up with the locking part; and when the handle rotates relative to the base frame at the fulcrum and drives the connecting rod to slide the carrier to the second position along the guiding structure restricting the movement of the carrier, the carrier tilts relative to the base frame.

2. The tray assembly of claim 1, wherein the guiding structure comprises a first guiding structure and a second guiding structure, the base frame further comprises:
   a base plate, the locking part being connected with the base plate; and a first side wall connected with the base plate and having the second guiding structure, wherein the second guiding structure and the first guiding structure are slidably connected.

3. The tray assembly of claim 2, wherein the first guiding structure is a guiding slot, and the second guiding structure is a guiding block.

4. The tray assembly of claim 2, wherein the first guiding structure is a guiding block, and the second guiding structure is a guiding slot.

5. The tray assembly of claim 4, wherein the second guiding structure comprises:
  a first guiding section formed along a first guiding direction; and
  a second guiding section connected with the first guiding section and located between the first guiding section and the locking part, the second guiding section formed along a second guiding direction, wherein an angle is formed between the second guiding direction and the first guiding direction.

6. The tray assembly of claim 5, wherein the first guiding direction and the base plate are substantially parallel to each other, the second guiding direction is away from the base plate as pointed towards the locking part.

7. The tray assembly of claim 2, wherein the carrier further comprises:
  a carrier plate abutting the storage device; and
  at least one side plate connected with the carrier plate, wherein the first guiding structure is located at the side plate.

8. The tray assembly of claim 7, wherein the carrier further comprises:
  a positioning part disposed on the carrier plate, configured for mutually snapping with a positioning hole of the storage device.

9. The tray assembly of claim 1, wherein the base frame further comprises a base plate and a second side wall, wherein the second side wall is connected with the base plate, and the handle comprises:
  the fulcrum pivoted to the second side wall;
  a first lever arm connected with the fulcrum and having a first length;
  a second lever arm connected with the fulcrum and pivoted to the connecting rod, and having a second length, wherein the first length is longer than the second length; and
  a grip connected with the first lever arm, wherein the handle locks up with the locking part by the grip.

10. The tray assembly of claim 9, wherein the first lever arm comprises:
  a pressing part, wherein when the grip locks up with the locking part, the pressing part presses the storage device.

* * * * *